(12) United States Patent
Lafontaine

(10) Patent No.: US 7,868,730 B2
(45) Date of Patent: Jan. 11, 2011

(54) COMMON-MODE FILTERING DEVICE AND SPEED VARIATOR COMPRISING SUCH A DEVICE

(75) Inventor: Jean Lafontaine, Maisons Laffitte (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 596 days.

(21) Appl. No.: 11/867,379

(22) Filed: Oct. 4, 2007

(65) Prior Publication Data
US 2008/0037298 A1 Feb. 14, 2008

(30) Foreign Application Priority Data
Jun. 10, 2006 (FR) .................................. 06 54133

(51) Int. Cl.
*H01F 27/28* (2006.01)
*H02M 1/14* (2006.01)
(52) U.S. Cl. .............................. 336/229; 363/47
(58) Field of Classification Search ............. 363/47; 336/83, 181, 221, 229
See application file for complete search history.

(56) References Cited

U.S. PATENT DOCUMENTS

| | | | | |
|---|---|---|---|---|
| 5,091,253 A * | 2/1992 | Smith et al. | ................. | 428/363 |
| 5,320,800 A * | 6/1994 | Siegel et al. | ................. | 419/66 |
| 5,581,224 A | 12/1996 | Yamaguchi | | |
| 6,456,182 B1 * | 9/2002 | Katayama et al. | ........... | 336/181 |
| 6,559,808 B1 * | 5/2003 | Petzold et al. | .............. | 343/787 |
| 6,750,752 B2 * | 6/2004 | Werlau | ....................... | 336/229 |
| 2005/0258705 A1 * | 11/2005 | Berwald et al. | ............. | 310/216 |
| 2006/0125586 A1 * | 6/2006 | Lee et al. | ..................... | 336/83 |

FOREIGN PATENT DOCUMENTS

| | | |
|---|---|---|
| GB | 2 215 547 A | 9/1989 |
| JP | 62-7101 | 1/1987 |
| JP | 4-318906 | 11/1992 |
| WO | WO 2006/038545 A1 | 4/2006 |

\* cited by examiner

*Primary Examiner*—Adolf Berhane
*Assistant Examiner*—Emily Pham
(74) *Attorney, Agent, or Firm*—Oblon, Spivak, McClelland, Maier & Neustadt, L.L.P.

(57) ABSTRACT

The invention relates to a filtering device which includes a common-mode inductor ($L_F$) comprising a winding ($L_1$, $L_2$) on each line of an AC power supply and a magnetic core made up of a first torus ($T_1$) and a second torus ($T_2$). The first torus ($T_1$) has a first magnetic permeability ($\mu_1$) and the second torus ($T_2$) has a second magnetic permeability ($\mu_2$, $\mu'_2$), the first permeability being equal to or greater than three times the second permeability, in order to prevent the common-mode inductor from saturating in the resonant frequency range of the filtering device. Application to the EMC filter of a speed variator.

9 Claims, 2 Drawing Sheets

COMMON-MODE FILTERING DEVICE AND SPEED VARIATOR COMPRISING SUCH A DEVICE

The present invention relates to a common-mode filtering device, such as an EMC (electromagnetic compatibility) filter used at the input of a speed variator of the frequency converter type which is supplied by an AC power supply and is intended for controlling a synchronous or asynchronous electric motor. The invention also relates to a speed variator comprising such a filtering device.

As is known, a speed variator of the frequency converter type includes a rectifier module that delivers a DC voltage from an external AC power supply. The speed variator then includes an inverter module (or chopper) provided with semiconductor power electronic components for chopping the DC voltage in PWM (pulse width modulation) mode so as to deliver as output, via a power cable, a pulsed variable electrical voltage and a variable rotation frequency to the motor. A variator control device can turn the semiconductor components on and off at the sampling frequency so as to operate the motor in PWM mode with an appropriate variable voltage.

The switching frequency for PWM operation of the power semiconductors corresponds to the sampling frequency of the variator. Depending on the type and rating of the variator, this switching frequency generally varies between approximately 2 and 16 kHz.

The switching of the power semiconductors generates, as output of the speed variator, a variation in the common-mode voltage resulting, upstream and downstream of the conversion system, in common-mode electromagnetic interference, through a loop via the earth of the leakage currents due, in particular, to the stray capacitances of both the motor and the power cable. A filtering device is therefore often used to attenuate the common-mode currents absorbed at the electric distribution network and to avoid their propagation towards the power supply.

An EMC filter is placed upstream of the rectifier module of the speed variator and is connected between the AC power supply and the rectifier module of the variator. Depending on the size of the filter and the size and type of the variator, the filter may either be integrated into the variator package or may be external to the variator. In particular to meet the current European standards on electromagnetic compatibility, the EMC filter must be effective in a frequency range lying between 150 kHz and 30 MHz.

The EMC filter usually includes a common-mode inductor comprising a winding on each conducting line of the power supply, and common-mode capacitors connected between each line and earth, downstream of the common-mode inductor. The filter thus forms a passive circuit of the low-pass type with a cut-off frequency allowing the desired attenuation of the common-mode currents in the frequency range set by the standards to be obtained.

The desired cut-off frequency range of the EMC filter sets the values of the common-mode capacitors and inductor. The capacitance of the common-mode capacitors is in general constant, whereas the inductance of the common-mode inductor depends strongly on the common-mode currents flowing through it. These currents are functions of the common-mode voltage generated by the switching of the switches of the speed variator and of the stray capacitances of the main elements, namely the motor and the power cable. Depending on the accepted level of the common-mode currents, the common-mode inductor must therefore be large-sized so as not to saturate.

Since the EMC filter is a second-order passive circuit, it has a resonant frequency close to its cut-off frequency. Thus, it may happen that, within a certain frequency band around the resonant frequency, the EMC filter amplifies the common-mode currents instead of attenuating them, thus favouring saturation of the inductor.

This resonant frequency obviously depends on the inductance of the common-mode inductor, which depends on the common-mode current. Therefore, the resonant frequency also varies according to whether or not the speed variator is driving a load. Thus, the resonant frequency may, for example, be around 8 to 16 kHz for a ferrite inductor of the EMC filter and, for example, around 2 to 8 kHz for an inductor made of a nanocrystalline material. It is found that these frequencies are close to the usual sampling frequencies of a variator.

To achieve more effective filtering it is desirable therefore to install a filtering device that includes means for preventing, in a very simple and inexpensive manner, the common-mode inductor of the EMC filter from saturating in a frequency range lying close to the resonant frequency of the EMC filter (i.e. in the region of 1 to 16 kHz), without thereby degrading the performance of the EMC filter in the normative frequency filtering range, above 150 kHz.

Patent Application FR 06/52040 already discloses a solution that recommends the use of a suitable shunt circuit. This solution is economically advantageous, especially for low-power variators, for example those with a power of less than 5 kW. For high-power variators, it is also possible to employ two-stage (4th order) filters, but this solution is bulky and expensive. The object of the invention is therefore to propose a solution suitable for higher-power variators that is based on a single-stage (2nd order) filtering device.

For this reason, the invention discloses a filtering device connected to an AC power supply, the filtering device including a common-mode inductor comprising a winding on each line of the power supply and a magnetic core made up of a first torus and a second torus. The first torus is made from a first material having a first magnetic permeability and the second torus is made from a second material having a second magnetic permeability. The saturation induction of the first material is substantially equal to or greater than the saturation induction of the second material. In addition, the first magnetic permeability is equal to or greater than three times the second magnetic permeability at a frequency of 10 kHz of a current flowing through the windings, in order to prevent the common-mode inductor from saturating in the resonant frequency range of the filtering device.

According to one feature, the first material and the second material are nanocrystalline materials of different structure. According to another feature, the first material is a nanocrystalline material and the second material is a ferrite material. A ferrite material has the advantage of being less expensive but a nanocrystalline material offers better temperature resistance.

Thanks to the invention, it may thus be advantageous to greatly reduce the size of the EMC filter of a speed variator, while still maintaining its filtering performance at 150 kHz and above, and therefore to reduce the cost of the filter and the variator. By eliminating the saturation of the common-mode inductor of the EMC filter in the resonant frequency range of the EMC filter (at around a few kHz), it also becomes possible for the sampling frequency of the variator to be continuously varied over the entire operating range (generally between approximately 2 and 16 kHz) without impairing the performance of the EMC filter. The invention also makes it possible to reduce the heating of the EMC filter and to reduce the leakage self-inductance, owing to a fewer number of turns. In addition, depending on the capacitance of the common-mode capacitors of the EMC filter, it will also be possible to allow the length of the power cables between the variator and the motor to be considerably increased.

Other features and advantages will become apparent in the following detailed description referring to an embodiment given by way of example and represented by the appended drawings in which.

Figure 1:
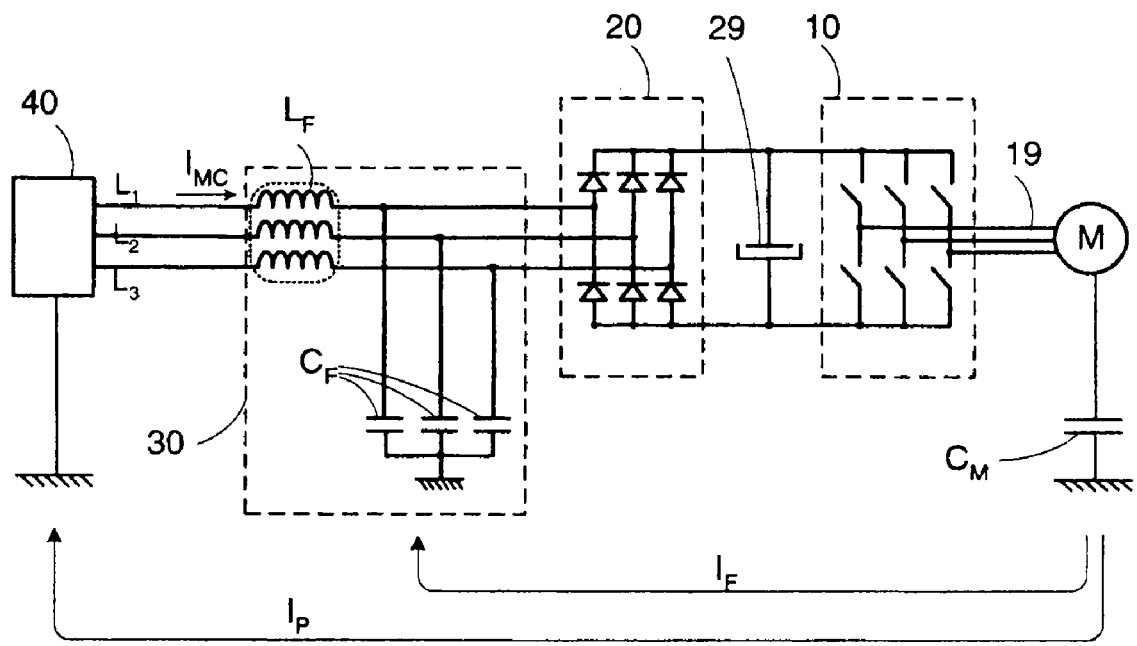
FIG. 1 shows a known simplified circuit diagram of a speed variator.

Referring to the simplified circuit diagram of FIG. 1, a speed variator is intended for operating an electric motor M of the synchronous or asynchronous type. The variator comprises an inverter module 10 connected to the motor M via a power cable 19. For each phase of the motor, the inverter module 10 has two semiconductor power electronic components of the IGBT type or other such components (shown in FIG. 1 as simple switches in order to simplify the drawing) which are capable of delivering a pulsed voltage in PWM mode to the motor M from a DC voltage bus.

The variator also includes, upstream of the inverter module 10, a rectifier module 20 that delivers the DC voltage bus in order to supply the inverter module 10. A ballast capacitor 29 is placed between the rectifier module 20 and the inverter module 10.

The rectifier module 20 is supplied by an external power supply 40 delivering a three-phase AC voltage $L_1$, $L_2$, $L_3$, for example in a TT network in which the neutral is connected to earth. Conventionally, the rectifier module 20 comprises diode bridges positioned so as to deliver the DC voltage bus. FIG. 1 shows an external three-phase power supply but the invention applies equivalently to a single-phase power supply. Likewise, the motor M depicted in FIG. 1 is supplied with three-phase voltage, but the invention of course also applies to an electric motor supplied with single-phase voltage.

A filtering device 30 made up of an EMC filter is positioned between the power supply 40 and the rectifier module 20. The characteristics of this EMC filter are designed to allow the speed variator to meet the EMC standards within a frequency range above 150 kHz. The EMC filter 30 includes a common-mode inductor $L_F$ connected in series between the supply 40 and the rectifier module 20. It is made up of a winding on each line $L_1$, $L_2$, $L_3$ of the power supply, the windings being magnetically coupled together. The EMC filter 30 also includes common-mode capacitors $C_F$ connected between each line $L_1$, $L_2$, $L_3$ and earth, downstream of the common-mode inductor $L_F$. The EMC filter 30 may also include differential capacitances between phases (differential filtering) that are not shown in FIG. 1. Depending on the size of the filter and the rating and type of the variator, the EMC filter 30 may either be integrated into the variator package or may be external to the variator.

It is known that the motor M and the cable 19 have distributed stray capacitances at earth, which may be modelled by a common capacitor $C_M$. Switching the semiconductors of the inverter module 10 causes very large voltage variations that create common-mode current $I_{MC}$ given by $I_{MC}=C_M \times dV/dt$.

This common-mode current $I_{MC}$ loops back through the earth via the motor/cable capacitor $C_M$, following either a path denoted by $I_F$ in FIG. 1, via the rectifier module 20, the inverter module 10, $C_M$ and $C_F$ or a path denoted by $I_P$ via the rectifier module 20, the inverter module 10, $C_M$, the power supply 40 and $L_F$. To minimize the propagation of interference on the external network, it is obviously desirable to favour the path $I_F$ rather than the path $I_P$ in order to prevent interference on the external power network from propagating. For this purpose, lower impedance values for the common-mode capacitors $C_{F1}$, $C_{F2}$, $C_{F3}$ and high impedance values for the common-mode inductor $L_F$ are therefore used.

However, the longer the cable 19, the greater the capacitance of the capacitor $C_M$ and the greater the common-mode current $I_{MC}$. In certain applications, there is therefore a risk of the common-mode inductor $L_F$ saturating, which will no longer filter out the current $I_{MC}$. In this case, the path $I_F$ runs the risk of no longer being the preferential path, thereby impairing the performance of the EMC filter. This risk of saturation may be exacerbated at the moment that the semiconductor components of the inverter module 10 switch, that is to say at a switching frequency for PWM operation of the power semiconductors. This switching frequency corresponds to the sampling frequency of the variator, that is to say generally between approximately 2 and 16 kHz.

Thus, at this sampling frequency, there is a risk of current peaks appearing on the power supply side that are due to the saturation of the common-mode inductor $L_F$ when the common-mode current $I_{MC}$, generated by the switching of the semiconductors of the inverter module 10, is high and is amplified by the resonance of the input EMC filter. Means must therefore be found to eliminate the resonance of the EMC filter and thus limit the rise in common-mode current $I_{MC}$ flowing in the common-mode inductor $L_F$.

One of the objects of the invention is therefore to propose a system capable of preventing the common-mode inductor $L_F$ from saturating in the resonant frequency range of the EMC filter, without degrading the performance of the EMC filter in the frequency range of above 150 kHz, in order to meet the EMC standards.

Figure 2:
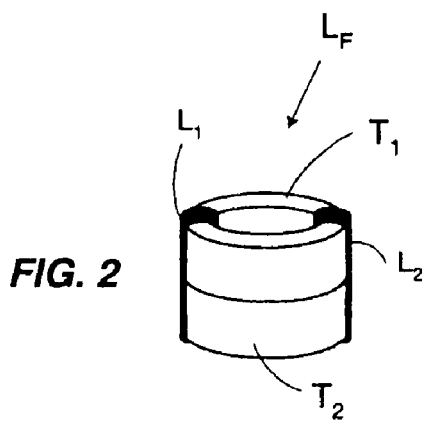
FIGS. 2 and 3 show exemplary embodiments of a common-mode inductor of the filtering device according to the invention.

Referring to FIG. 2, the common-mode inductor $L_F$ comprises a winding $L_1$, $L_2$ on each line of a power supply and a magnetic core made up of a first torus $T_1$ and a second torus $T_2$. In this example, and for the convenience of the drawing, the power supply comprises only two supply lines $L_1$, $L_2$ (single-phase supply).

The first torus $T_1$ is juxtaposed with the second torus $T_2$ and the supply lines are wound simultaneously around the two tori with the same number of turns, equal to n. According to the invention, the first torus $T_1$ is made from a first material having a first magnetic permeability $\mu_1$ and the second torus $T_2$ is made from a second material having a second magnetic permeability $\mu_2$. The value of $\mu_1$ is equal to or greater than three times the value of the second magnetic permeability $\mu_2$. The purpose of having a large difference between the two magnetic permeability values is to take full advantage of the different properties of each material and to allow the desired effect to be achieved.

The notion of "magnetic permeability" used throughout the present document represents, in fact, the relative magnetic permeability of a material, relative to the permeability of free space. For the sake of consistency and unless indicated otherwise, this relative magnetic permeability is an initial magnetic permeability, that is to say measured for a current flowing through the windings of the common-mode inductor of low value and having a frequency of 10 kHz.

Figure 3:
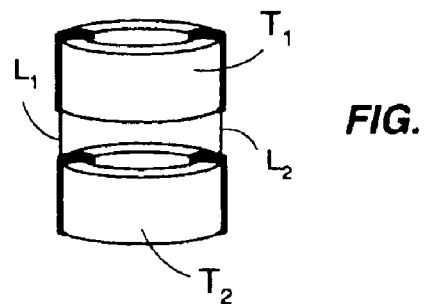

FIG. 3 shows a variant of FIG. 2. In this case, the common-mode inductor $L_F$ comprises two tori $T_1$ and $T_2$ that are not juxtaposed but separated, and the power lines $L_1$, $L_2$ pass firstly through the first torus $T_1$ with a first number of turns $n_1$ and then the second torus $T_2$ with a second number of turns $n_2$. This variant is equivalent to the example shown in FIG. 2 if $n_1$ and $n_2$ are equal to n. However, this requires two series of windings.

Various structures of the common-mode inductor $L_F$ are possible. For example, it does not matter whether the inductor $L_F$ comprises tori $T_1$ and $T_2$ having the same dimensions (see FIGS. 2 and 3) or whether they have different shapes and sizes. One torus could, for example be inserted into the internal space of the other torus. Likewise, in the case shown in FIG. 3, the number of turns $n_1$ and $n_2$ may be the same or different, depending on the desired characteristics of the EMC filter. Moreover, the supply lines $L_1$, $L_2$ could also pass firstly through the torus $T_2$ and then the torus $T_1$.

The first material is, for example, a nanocrystalline material, the grain diameter of which is around 10 to 20 nm or less, so as to obtain a first magnetic permeability $\mu_1$ of 50 000 or higher. Preferably, a first material having a magnetic permeability $\mu_1$ of around 60 000 to 100 000 and with a saturation induction of around 1.2 to 1.5 tesla will be chosen.

The second material must possess a magnetic permeability less than one third of the magnetic permeability of the first material. This second material may especially be a ferrite, which has the advantage of being inexpensive and possesses, for example, a magnetic permeability $\mu_2$ of around 8000 to 10 000 with a saturation induction of around 0.5 tesla.

The second material could also be a nanocrystalline material of a structure and/or a composition that differ from the first material, so as to obtain a magnetic permeability $\mu'_2$ of 30 000 or less. Preferably, a second material having a magnetic permeability $\mu'_2$ of around 10 000 to 20 000 with a saturation induction of around 1.2 to 1.5 tesla will be chosen.

Thus, the ratio of the magnetic permeabilities $\mu_1$ and $\mu_2$ (or $\mu'_2$) preferably will be equal to or greater than 4, for example, with $\mu_1$ around 100 000 and $\mu_2$ (or $\mu'_2$) around 20 000, or $\mu_1$ around 60 000 and $\mu_2$ (or $\mu'_2$) around 10 000.

Moreover, the ferrite is less expensive than the nanocrystalline material, but does have the disadvantage of losing its characteristics at high temperature, typically above the Curie point, which is generally close to 100° C., and therefore of filtering less effectively, something which is not the case for the nanocrystalline material. The embodiment consisting in using two nanocrystalline materials, with different magnetic permeabilities $\mu_1$ and $\mu'_2$ for the first torus and second torus respectively, thus makes it possible to achieve acceptable filtering performance up to temperatures of around 150° C.

Figure 4:
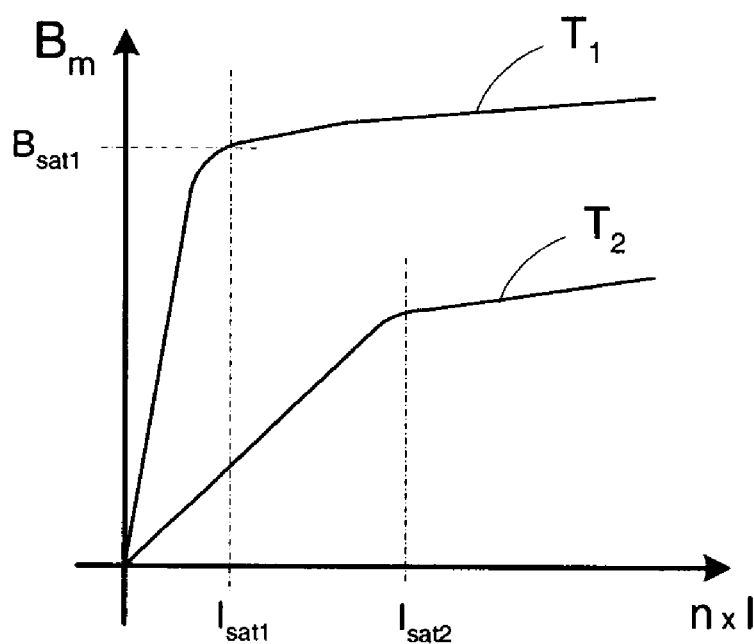
FIG. 4 shows a diagram of the magnetic induction of an inductor as a function of the ampere-turns for a frequency of the order of 10 kHz.
Figure 5:
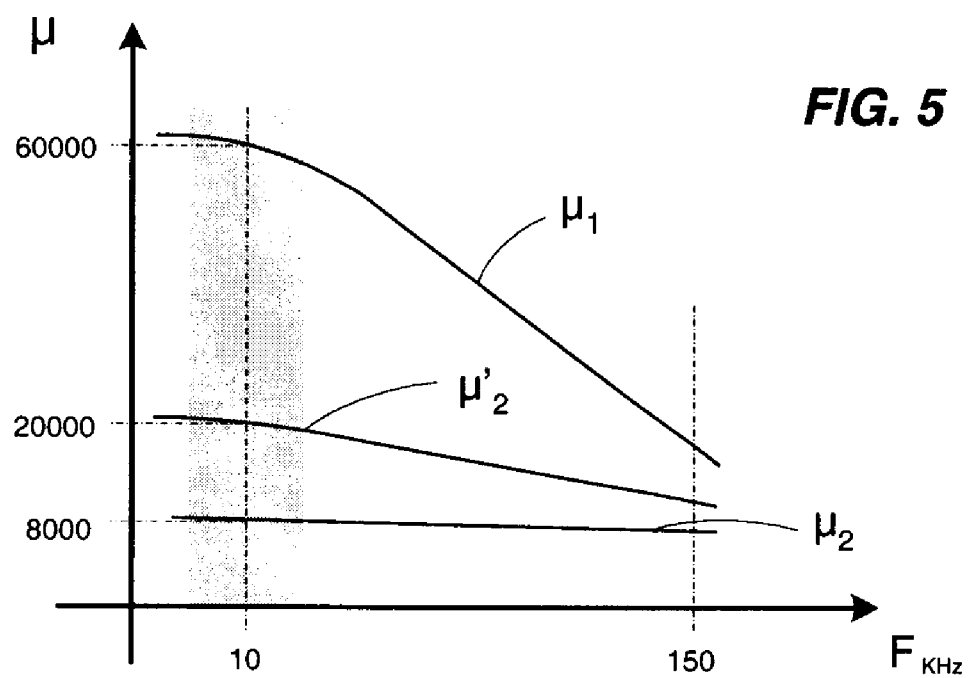
FIG. 5 shows a diagram of the relative magnetic permeability of the various materials as a function of the frequency.

FIG. 4 shows, for different magnetic materials of the core of an inductor, different curves giving the magnetic induction B as a function of the ampere-turns n×I of the inductor (winding of n turns through which a current I flows) at a frequency of the order of 10 kHz. FIG. 5 shows various examples of the magnetic permeability as a function of the frequency. It should be noted that a high magnetic permeability $\mu_1$ at a frequency of 10 kHz drops substantially as the frequency increases between 10 kHz and 150 kHz, unlike a lower magnetic permeability $\mu_2$. In FIG. 5, the area shaded grey symbolizes, approximately, the region in the vicinity of the resonant frequency.

FIG. 4 shows that the saturation induction $B_{sat1}$ of the first material is greater than the saturation of the second material. The second torus $T_2$ has a lower magnetic permeability $\mu_2$, which means that the magnetic induction rises quite slowly as the current increases (see FIG. 4). To reach the saturation current $I_{sat2}$, it is therefore necessary to have a higher ampere-turns value n×I. In contrast, since the first torus $T_1$ has a high magnetic permeability $\mu_1$, the magnetic induction rises very rapidly with current, and the saturation current $I_{sat1}$ corresponding to a saturation induction $B_{sat1}$ is very quickly reached.

Thus, an inductor $L_F$ having a core made up of only a material having a high magnetic permeability $\mu_1$ has the advantage of having a high inductance at low frequency and therefore of providing effective common-mode filtering, but has the disadvantage of rapidly saturating with little current flowing in the inductor. This is because the inductance is proportional to the magnetic permeability u of the material of the core of the inductor, whereas the saturation current $I_{sat}$ is inversely proportional to this magnetic permeability μ.

Conversely, an inductor $L_F$ having a core made up of only a material with a low magnetic permeability $\mu_2$ has the advantage of supporting higher ampere-turns before saturating, but has the disadvantage of having a lower inductance at low frequency and therefore of providing less effective common-mode filtering.

The invention therefore combines these two different materials in series in a common-mode inductor $L_F$ so as to benefit from the advantages of each of them, by adding the effects of the two technologies.

The operation of such a common-mode inductor is as follows:

Initially, at low frequency below the sampling frequency of the variator, the effects of $T_1$ and $T_2$ for filtering out the corresponding common-mode current $I_{MC}$ are combined. In particular, the filtering obtained by $T_1+T_2$ is much more effective than if there is only a single torus $T_2$ of equivalent size having a low magnetic permeability.

As the frequency and the corresponding common-mode current $I_{MC}$ increases, the ampere-turns increase and the theoretical saturation threshold $I_{sat1}$ of the torus $T_1$ is reached rapidly since its magnetic permeability $\mu_1$ is high. Therefore, if $T_1$ were the only torus, the common-mode current $I_{MC}$ would then increase very rapidly. However, thanks to its low magnetic permeability $\mu_2$ (or $\mu'_2$), the torus $T_2$ is not saturated and therefore the common-mode current $I_{MC}$ will be limited so as to remain close to the saturation value $I_{sat1}$ in the saturation bend of the curve $T_1$ in FIG. 4 (i.e. an operation with quasi-saturation of $T_1$).

If the torus $T_1$ is saturated at low frequency and the torus $T_2$ is not, then, when the frequency of the common-mode current continues to increase, the permeability $\mu_1$ of $T_1$ will decrease as indicated in FIG. 5, this having the consequence of advantageously increasing its saturation threshold $I_{sat1}$. Thus, thanks to the presence of $T_2$, which allows operation to remain in the saturation bend of the torus $T_1$, it will be possible above a certain frequency to return to below the saturation threshold $I_{sat1}$ up to the frequency of 150 kHz, provided that the characteristics of the EMC filter are designed to move the resonant frequency of the EMC filter away from the sampling frequency range of the variator.

If the common-mode current $I_{MC}$ remains below the saturation threshold $I_{sat1}$, the saturation of the torus $T_1$ could however be due to the resonance of the EMC filter created by the excitation of the common-mode current harmonics generated at the sampling frequency of the variator. In this case, the saturation of the torus $T_1$ advantageously modifies the inductance of the common-mode inductor, which now includes only the torus $T_2$, thereby modifying the resonant frequency of the EMC filter and therefore suppressing its resonance.

Thus, when an EMC filter of a variator uses a conventional common-mode inductor, the length of the power cable is limited to a few meters since the saturation of the inductor is rapidly reached whatever the nature of the magnetic material used. This is because, if the magnetic material has a low permeability, the saturation is due to a low limit of the common-mode current. If the magnetic material has a high permeability the saturation is due to the magnetic induction, which rises very rapidly with the common-mode current.

Using a common-mode inductor $L_F$ comprising two tori with very different magnetic permeabilities according to the invention has the benefit both of a greatly limited common-mode current (the effect of torus $T_1$) and of a magnetic material whose induction rises slowly (the effect of torus $T_2$). It is therefore possible to prevent this inductor from saturating and therefore to ensure very good filtering of the common-mode current over the entire frequency range.

Of course, it is possible, without departing from the scope of the invention, to conceive of other variants and detailed improvements and likewise to envisage the use of equivalent means.

The invention claimed is:

1. A filtering device connected to an AC power supply, comprising:
   a common-mode inductor comprising a winding on each line of the power supply; and
   a magnetic core made up of a first torus and a second torus, the first torus being juxtaposed with respect to the second torus, wherein
   the first torus is made from a first nanocrystalline material having a first magnetic permeability and the second torus is made from a second material having a second magnetic permeability;
   a saturation induction of the first material is substantially equal to or greater than a saturation induction of the second material, and
   the first magnetic permeability is equal to or greater than three times the second magnetic permeability at a frequency of 10 kHz of a current flowing through the windings to prevent the common-mode inductor from saturating in a resonant frequency range of the filtering device.

2. The filtering device according to claim 1, wherein the first magnetic permeability is equal to or greater than 50 000 at a frequency of 10 kHz of the current flowing through the windings.

3. The filtering device according to claim 1, wherein the second magnetic permeability is equal to or less than 30 000 at a frequency of 10 kHz of the current flowing through the windings.

4. The filtering device according to claim 1, wherein the first material and the second material are nanocrystalline materials of different structure.

5. The filtering device according to claim 1, wherein the second material is a ferrite material.

6. The filtering device according to claim 1, wherein the first torus is juxtaposed with the second torus and in that each line winding passes simultaneously through the first torus and the second torus.

7. The filtering device according to claim 1, wherein each line winding passes through the first torus with a first number of turns and then passes through the second torus with a second number of turns.

8. A speed variator comprising a rectifier module supplied by an AC power supply, the speed variator including a filtering device according to one of the preceding claims, the filtering device being connected between the power supply and the rectifier module.

9. The filtering device according to claim 1, wherein the first torus is juxtaposed on top of the second torus and the winding on each line of the power supply is wound around the juxtaposed first and second tori, each winding of the power supply having a same number of turns.

* * * * *